US010962564B2

(12) United States Patent
Sasano et al.

(10) Patent No.: US 10,962,564 B2
(45) Date of Patent: Mar. 30, 2021

(54) PROBE PIN, INSPECTION JIG, INSPECTION UNIT AND INSPECTION DEVICE

(71) Applicant: OMRON Corporation, Kyoto (JP)

(72) Inventors: Naoya Sasano, Tokyo (JP); Hirotada Teranishi, Osaka (JP); Takahiro Sakai, Shiga (JP); Si-Hun Choi, Seoul (KR)

(73) Assignee: Omron Corporation, Kyoto (JP)

( * ) Notice: Subject to any disclaimer, the term of this patent is extended or adjusted under 35 U.S.C. 154(b) by 127 days.

(21) Appl. No.: 16/208,176

(22) Filed: Dec. 3, 2018

(65) Prior Publication Data

US 2019/0242926 A1   Aug. 8, 2019

(30) Foreign Application Priority Data

Feb. 7, 2018 (JP) .............................. JP2018-020451

(51) Int. Cl.
*G01R 1/067* (2006.01)
*G01R 31/00* (2006.01)
*G01R 1/04* (2006.01)

(52) U.S. Cl.
CPC ....... *G01R 1/06716* (2013.01); *G01R 1/0433* (2013.01)

(58) Field of Classification Search
CPC .............. G01R 1/0433; G01R 1/06716; G01R 1/06722; G01R 1/06733; G01R 1/06738; H01R 13/2407; H01R 13/2435; H01R 13/2485
See application file for complete search history.

(56) References Cited

U.S. PATENT DOCUMENTS

| | | | | |
|---|---|---|---|---|
| 4,341,433 A | * | 7/1982 | Cherian | H05K 7/1069 439/331 |
| 6,443,784 B1 | * | 9/2002 | Kimoto | H01R 13/2428 361/725 |
| 6,791,345 B2 | * | 9/2004 | Maruyama | G01R 1/06716 324/754.08 |
| 7,619,430 B2 | * | 11/2009 | Jeon | G01R 1/07342 324/755.11 |

FOREIGN PATENT DOCUMENTS

| | | |
|---|---|---|
| JP | 2002-134202 A | 5/2002 |
| JP | 2002-231399 A | 8/2002 |
| JP | 2007-218776 A | 8/2007 |

(Continued)

OTHER PUBLICATIONS

Office Action issued in counterpart Taiwanese Patent Application No. 107142685, dated Jun. 13, 2019 (11 Pages).

(Continued)

*Primary Examiner* — Minh N Tang
(74) *Attorney, Agent, or Firm* — Osha Bergman Watanabe & Burton LLP

(57) ABSTRACT

A probe pin includes a first contact part and a second contact part; a middle part located between the first contact part and the second contact part; a first flexible part configured to move the first contact part relative to the middle part in the first arrangement direction; and a movable part configured to move the second contact part relative to the middle part in a direction intersecting with the first arrangement direction.

18 Claims, 18 Drawing Sheets

(56) References Cited

FOREIGN PATENT DOCUMENTS

| | | | |
|---|---|---|---|
| JP | 2017223629 | A | 12/2017 |
| TW | 201625959 | A | 7/2016 |
| TW | 201713953 | A | 4/2017 |

OTHER PUBLICATIONS

Office Action issued in Korean Application No. 2018-0152302; dated Oct. 10, 2019 (8 pages).
Notice of Reasons for Refusal issued in Application No. 2018-020451, dated Feb. 16, 2021 (8 pages).

* cited by examiner

PROBE PIN, INSPECTION JIG, INSPECTION UNIT AND INSPECTION DEVICE

CROSS-REFERENCE TO RELATED APPLICATION

This application claims the benefit of Japanese Patent Application No. 2018-020451, filed Feb. 7, 2018.

BACKGROUND

Field

The present disclosure relates to a probe pin, an inspection jig equipped with the probe pin, an inspection unit equipped with the inspection jig, and an inspection device equipped with the inspection unit.

Related Art

The conductivity and operational characteristics of electronic component modules, e.g., cameras or liquid crystal panels, are typically inspected during manufacturing. During these inspections, a probe pin is used to connect the inspection device to electrodes on electronic component module, for example, an FPC contact electrode installed for connection to the main board of the electronic component module or an electrode on a board-to-board connector package.

For instance, Japanese Patent Application Publication No. 2002-134202 describes such a probe pin. The probe pin is equipped with a pair of contacts, and a winding part interposed between the pair of contacts; the winding part connects the pair of contacts, and each contact is configured to make contact with an electrode terminal on an electronic component and an electrode terminal on the connected electronic component. The winding part of the probe pin can expand and contract along an arrangement direction along which the contacts are connected; the contacts move back and forth along this arrangement direction whereby the contacts touch the electrode terminal on the electronic part and the electrode terminal on the connected electronic component.

SUMMARY

The growing variety of inspection devices and objects for inspection has led to more cases that are difficult for a so-called linear probe pin to handle; each contact in a linear probe pin travels back and forth in the same direction.

For instance, a display module may be inspected while the electrodes are disposed on the display panel. If a linear probe pin is used for this kind of inspection, one of the contacts is in contact with the electrode on the display panel, and the other contact is in contact with the inspection device; however, if the display panel is made from a mechanically weak material, like an organic EL panel, it is likely that the aforementioned probe pin causes an excess force to act on the display, and breaks the display.

To address the foregoing, herein is provided a probe pin capable of contacting an inspection object in a direction that is different from the direction the probe pin contacts the inspection device. An inspection jig equipped with the probe pin, an inspection unit equipped with the inspection jig, and an inspection device equipped with the inspection unit are also provided.

An example of a probe pin described herein includes:
a first contact part and a second contact part;
a middle part located between the first contact part and the second contact part;
a first flexible part connected to the first contact part and the middle part and expanding and contracting along a first arrangement direction connecting the first contact part and the middle part to move the first contact part relative to the middle part in the first arrangement direction; and
a movable part connected to the middle part and the second contact part and configured to move the second contact part relative to the middle part in a direction intersecting with the first arrangement direction; wherein
the first contact part, the first flexible part, the middle part, the movable part, and the second contact part are arranged linearly.

An example of an inspection jig described herein includes:
the aforementioned probe pin; and
a socket including a receptacle for receiving the probe pin;
the socket including:
a stopper; the stopper preventing the middle part of the probe pin accommodated in the receptacle from moving from the first contact part toward the second contact part along the first arrangement direction.

An example of an inspection unit described herein includes:
at least one of the aforementioned inspection jigs.

An example of an inspection device described herein includes:
at least one of the aforementioned inspection units.

Effects

The first contact part in the aforementioned probe pin is configured to move relative to the middle part by way of the first flexible part in a first arrangement direction, the first arrangement direction connecting the first contact part and the middle part; the second contact part is configured to move relative to the middle part in a direction intersecting with the first arrangement direction by way of the movable part. The probe pin thusly achieved can contact an inspection object in a direction that is different from the direction the probe pin contacts the inspection device.

Additionally, the aforementioned probe pin allows implementation of the aforementioned inspection jig which can thus support a diverse set of inspection devices and inspection objects.

Further, the aforementioned inspection jig allows implementation of the aforementioned inspection unit which can thus support a diverse set of inspection devices and inspection objects.

Finally, the aforementioned inspection unit allows implementation of the aforementioned inspection device which can thus support a diverse set of inspection devices and inspection objects.

DETAILED DESCRIPTION

Examples are described below with reference to the attached drawings. Note that, while terms representing specific directions and positions (such as, terms including "up", "down", "right", and "left") are used in the following description, the use of these terms are merely for facilitating an understanding of the disclosure with reference to the drawings. The meanings of these terms are not intended to limit the technical scope of the present disclosure. The following description merely provides an example, and is not intended to limit the present disclosure, where the disclosure is to be adopted, or how the disclosure is to be used. Moreover, the drawings provided are schematic and are not intended to indicate a scale for actual measurements.

First Embodiment

Figure 1:
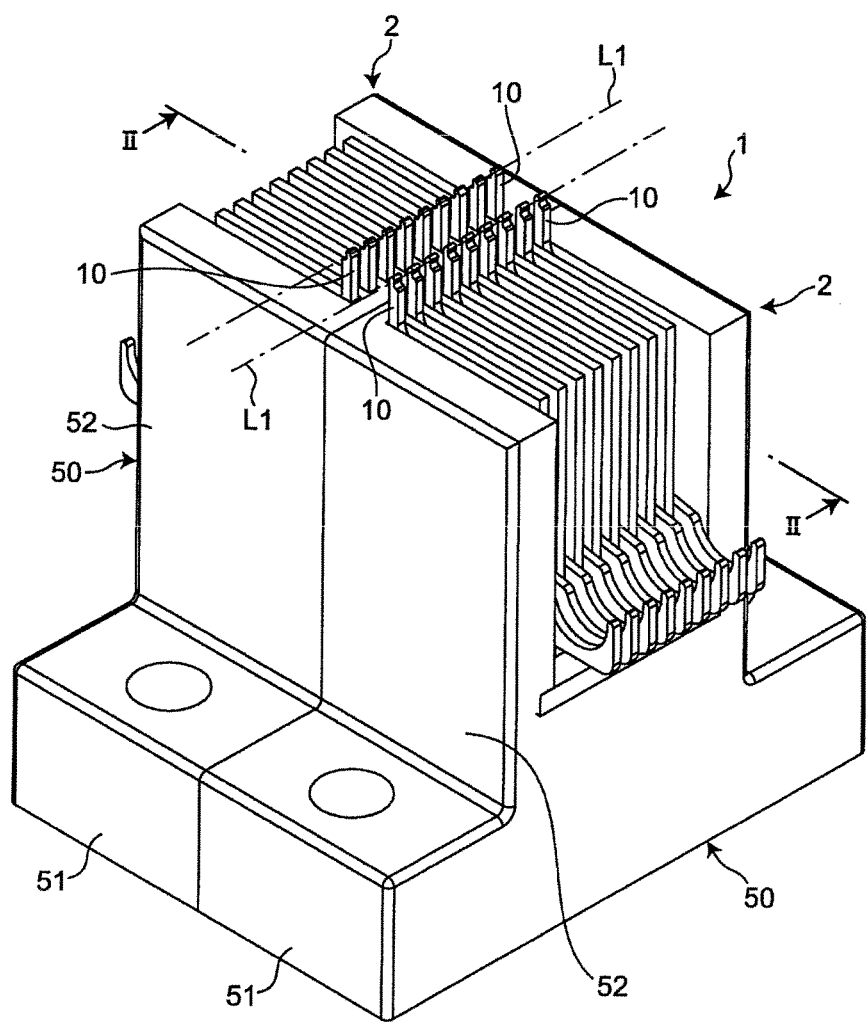
FIG. 1 is a perspective view illustrating an inspection unit and an inspection jig according to a first embodiment.
Figure 2:
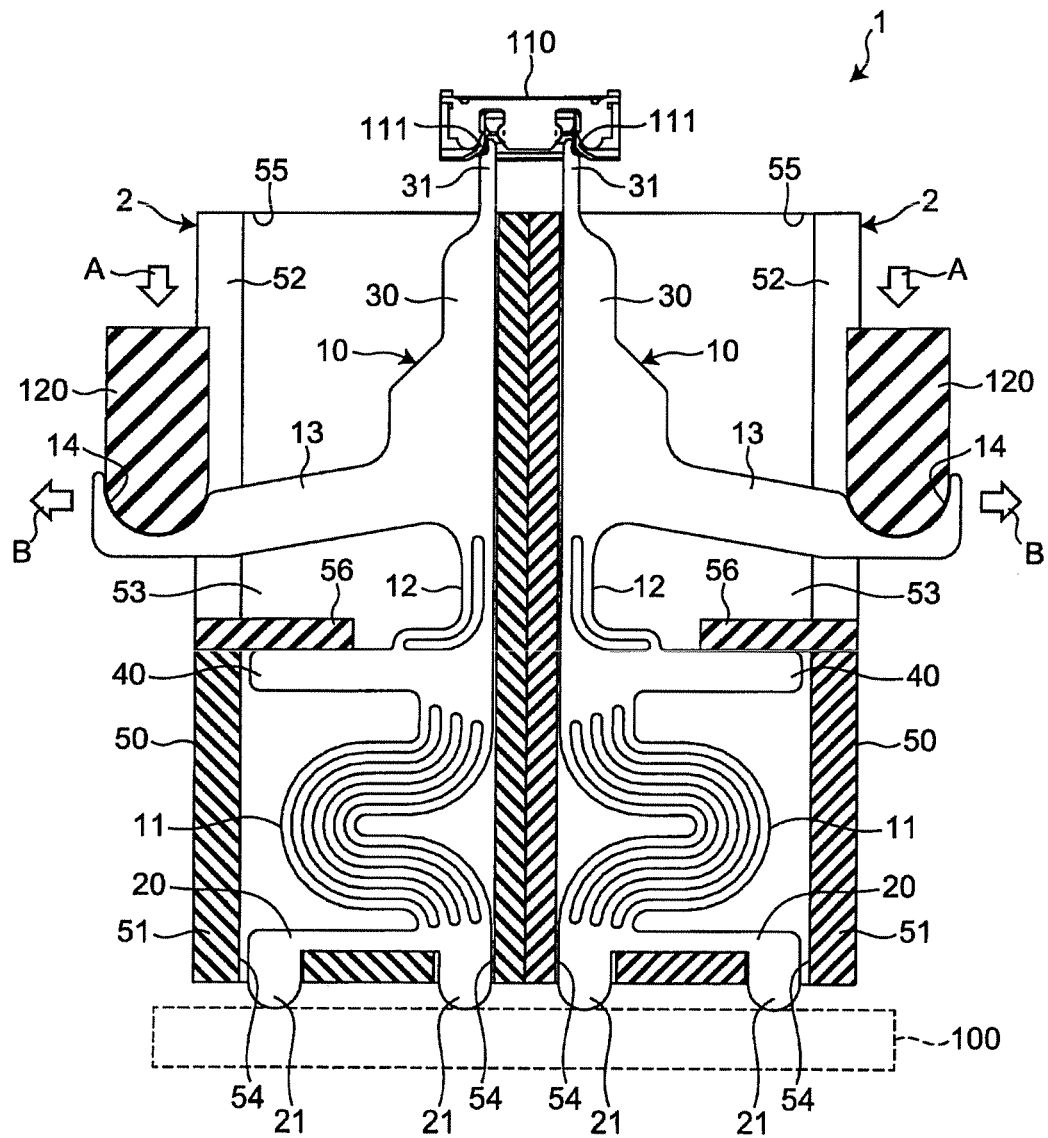
FIG. 2 is a cross-sectional view along the line II-II.

A probe pin 10 according to the first embodiment is conductive, and, for instance, as illustrated in FIG. 1 and FIG. 2, the probe pin 10 is used while accommodated in a socket 50, and together with the socket 50 make up an inspection jig 2. As an example, this inspection jig 2 accommodates a plurality of probe pins 10 that are plurality of long, narrow laminates.

The inspection jig 2 also constitutes a part of an inspection unit 1. The inspection unit 1 is made up of at least one inspection jig 2. As illustrated in FIG. 1, in the first embodiment the inspection unit 1 is made up of two adjacent inspection jigs 2.

The socket 50 is made up of a substantially rectangular flat part 51 and a substantially cuboid-like rectangular body 52 connected at the center lengthwise of this flat part 51 creating a substantially T-shaped box as illustrated in FIG. 1. In addition, as illustrated in FIG. 2, the flat part 51 and the rectangular body 52 are provided with a plurality of receptacles 53 each capable of receiving a single probe pin 10.

The receptacles 53 are slit-like (FIG. 2) and are capable of receiving and retaining the probe pins 10 so that the probe pins 10 are electrically independent of each other. The receptacles 53 appear aligned along the length of the flat part 51, i.e., going through the drawing sheet of FIG. 2, when viewed from the connection direction of the flat part 51 and the rectangular body 52, i.e., the vertical direction in FIG. 2.

Both ends of each of the receptacles 53 are connected to a first opening 54 and a second opening 55 which are mutually opposite along the connection direction of the flat part 51 and the rectangular body 52. The first opening 54 is provided in the flat part 51 and the second opening 55 is provided in the rectangular body 52. In this first embodiment, the flat part 51 contains two first openings 54 per receptacle 53. The two first openings 54 appear to have a gap therebetween in the width direction of the flat part 51, i.e., the lateral direction in FIG. 2 when viewed from the connection direction of the flat part 51 and the rectangular body 52.

As illustrated in FIG. 2, a stopper 56 is provided at the middle of each of the receptacles 53 along the connection direction of the flat part 51 and the rectangular body 52; the stopper 56 appears to extend along the width of the flat part 51 when viewed from the connection direction of the flat part 51 and the rectangular body 52. The stopper 56 stops the middle part 40 of the probe pin 10 (later described) from moving in the receptacle 53 in the first arrangement direction from the first contact part 20 toward the second contact part 30. The stopper 56 may be provided integrally with the socket 50 or may be provided separately from the socket 50.

Figure 3:
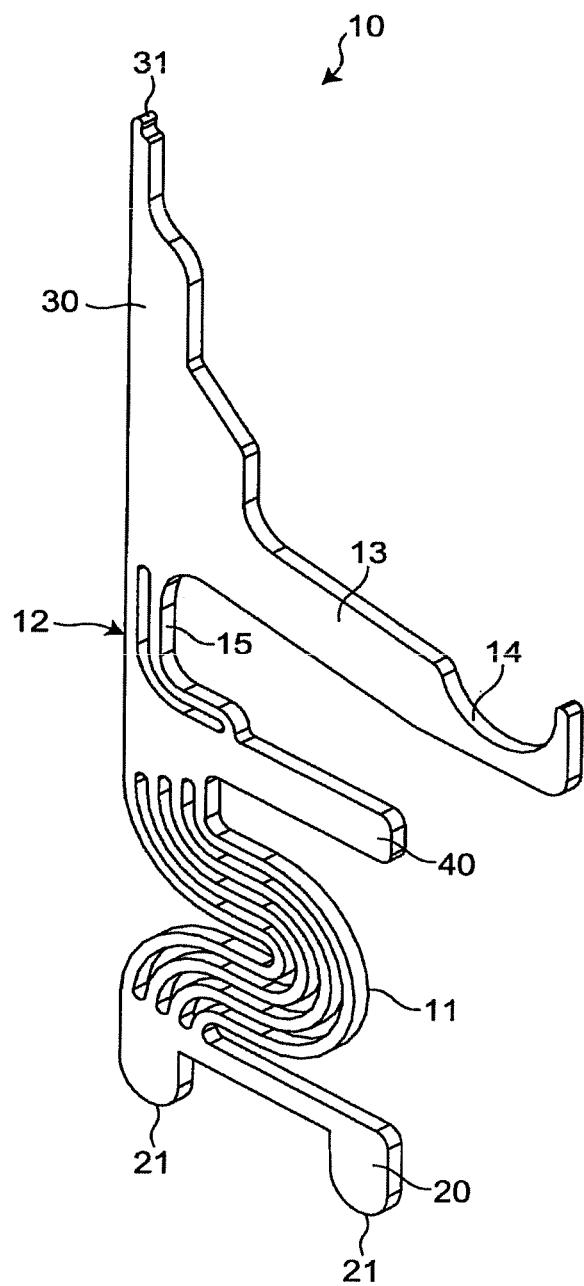
FIG. 3 is a perspective view of a probe pin according to the first embodiment.

As illustrated in FIG. 3, each of the probe pins 10 is flat, and is provided with a first contact part 20 and a second contact part 30; a middle part 40 is located between the first contact part 20 and the second contact part 30; a first flexible part 11 connected between the first contact part 20 and the middle part 40; and a movable part 12 connected between the middle part 40 and the second contact part 30. The probe pins may be electroplated with the first contact part 20, the first flexible part 11, the middle part 40, the movable part 12, and the second contact part 30 arranged linearly and integrally along the length of the probe pin 10, i.e., vertically in FIG. 3, when viewed from the thickness direction of the probe pin 10.

Figure 4:
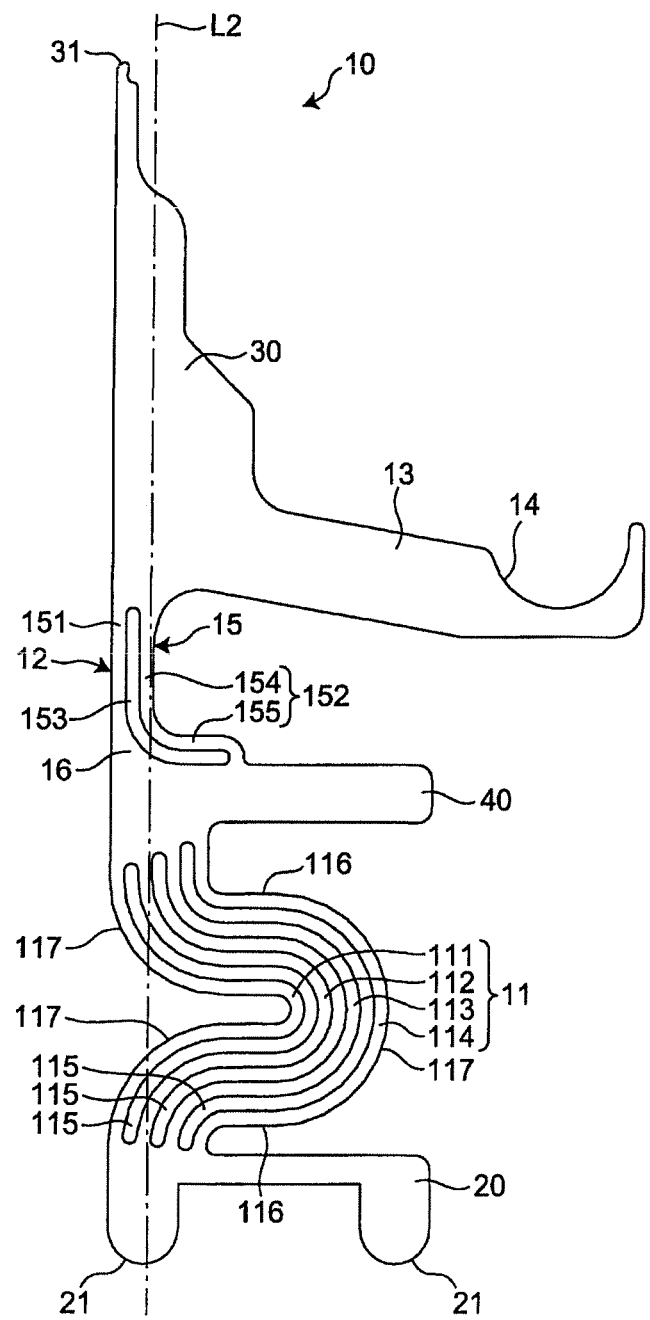
FIG. 4 is a plan view of the probe pin in FIG. 3.

As illustrated in FIG. 4, the first contact part 20 appears as a roughly rectangular shape that extends in the width direction of the probe pin 10 when viewed from the thickness direction of the probe pin 10. The first flexible part 11 is connected at one end of the first contact part 20 lengthwise of the probe pin 10, and a first contact 21 is provided at the other end lengthwise of the probe pin 10. A first contact 21 is provided at both ends along the extension direction of the first contact part 20. The first contacts 21 are exposed outside the socket 50 via the first opening 54 while in the receptacles 53 of the socket 50 (FIG. 2). The first contacts 21 are configured such that, for example, the first contacts 21 can connect to the terminals provided on a substrate 100 of an inspection device (not shown) in the first arrangement direction. That is, the connection direction of the first contacts 21 in relation to the terminals provided on a substrate 100 of an inspection device is roughly parallel to the first arrangement direction.

As illustrated in FIG. 1, the first contacts 21 of the probe pins 10 in the receptacles 53 are arranged along the same first virtual line L1 which is parallel to the length of the flat part 51 when viewed from the connection direction of the flat part 51 and the rectangular body 52, i.e., when viewed from the vertical direction in FIG. 1.

The second contact part 30 extends along the length of the probe pin 10 when viewed from the thickness direction of the probe pin 10 as illustrated in FIG. 4. A second contact 31 is provided at one end in this extension direction and the movable part 12 is connected at the other end in the extension direction. The second contact 31 is exposed outside the socket 50 via the second opening 55 while in the receptacle 53 of the socket 50 as illustrated in FIG. 2. The second contact is configured to connect, for instance, to the electrode 111 of a board-to-board connector 110 in a direction intersecting with the first arrangement direction. That is, the contact direction of the second contact 31 to the electrode 111 of the board-to-board connector 110 is roughly parallel to a direction intersecting with the first arrangement direction and is different from the contact direction of the first contacts 21 to the terminals provided on a substrate 100 of an inspection device.

Note that the second contact 31 extends along a first arrangement direction which connects the first contact part 20 and the middle part 40 (simply, "first arrangement direction", below) and is arranged along a second virtual line L2 that passes through the center of one of the first contact parts 20 (left of the first contact 21, FIG. 4) in a direction orthogonal to the first arrangement direction.

The second contacts 31 of a probe pin 10 in the receptacles 53 are arranged at the top along a straight line (not shown) parallel to the length of the flat part 51 when viewed from the connection direction of the flat part 51 and the rectangular body 52 similarly to the first contacts 21.

The second contact part 30 includes protrusions 13 extending in a direction intersecting with the first arrangement direction (e.g., almost orthogonal thereto) at the middle, between the second contact 31 and the movable part 12 in the first arrangement direction, i.e., at a later described second flexible part 15. The protrusion 13 includes for example a roughly square part extending from the second contact part 30 in a direction intersecting with the first arrangement direction, and is provided with half-circular notch 14 at the tip thereof toward the second contact point 31 along the length of the probe pin 10. An operation lever 120 may be connected to the notch 14 (FIG. 2), whereby an external force may be applied to the protrusion 13 in the first arrangement direction and toward the first contact part 20, i.e., the direction of the arrow A in FIG. 2, via the operation lever 120.

The middle part 40 includes a roughly square laminate extending in a direction intersecting with (e.g., orthogonal to) the first arrangement direction as illustrated in FIG. 4. The middle part 40 extends relative to the second virtual line L2 in the same direction as protrusion 13 of the second contact part 30.

The first flexible part 11 connects the first contact part 20 and the middle part 40 (FIG. 4); the first flexible part 11 expands and contracts along the first arrangement direction and is configured to move the first contact part 20 relative to the middle part 40 in the first arrangement direction.

More specifically, the first flexible part 11 is made up of a plurality of flexible strips (in this embodiment, four flexible strips 111, 112, 113, 114) arranged with alternating gaps 115 therebetween. The flexible strips 111, 112, 113, 114 form a winding shape with a plurality of linear strips 116 alternately connected to a plurality of curved strips 117 along the first arrangement direction. The plurality of linear strips 116 extend in a direction intersecting with (e.g., orthogonal to) the first arrangement direction. As an example, in this embodiment the flexible strips include two linear strips 116 and three arc-shaped curve strips 117.

The curved strips 117 at the ends of the first flexible part 11 are arranged along a second virtual line L2 with one end thereof in the extension direction connected to the second contact part 20 or the middle part 40. Note that the two linear strips 116 in the first flexible part 11 extend from the other end of a curved strip 117 connected to either the second contact part 20 or the middle part 40 in the extension direction relative to the second virtual line L2 toward the same side as the protrusion 13 of the second contact part 30 and the middle part 40.

The movable part 12 connects the middle part 40 in the second contact part 30 (FIG. 4); the movable part 12 is configured to move the second contact part 30 in a direction intersecting with the first arrangement direction.

More specifically, the movable part 12 includes a second flexible part 15 extending along the first arrangement direction. The second flexible part 15 is connected at one end in the first arrangement direction to the middle part 40 and at the other end in the first arrangement direction to the second contact part 30; the second flexible part 15 is configured to deform elastically in a direction intersecting with the first arrangement direction.

The second flexible part 15 includes a plurality of flexible strips (in this embodiment, two flexible strips 151, 152) arranged with alternating gaps 115 as illustrated in FIG. 4. The second flexible part 15 deforms elastically in accordance with an external force added to the second contact part 30 via the protrusion 13. The second flexible part 15 is configured to rotate the second contact part 30 (i.e., cause the same to move) about a connection part 16 between the second flexible part 15 and the middle part 40. In other words, the second flexible part 15 in the probe pin 10 according to the first embodiment is configured so that when an external force is applied to the protrusion 13 along the direction of the arrow A (FIG. 2) via an operation lever 120, the second flexible part 15 elastically deforms in a direction intersecting with the first arrangement direction, and the second contact part 30 moves relative to the middle part 40 about the connection part 16 between the second flexible part 15 and the middle part 40 in a direction intersecting with the first arrangement direction.

The linear part of the flexible strip 151 located on one side in a direction orthogonal to the first arrangement direction, i.e., left in FIG. 4, is along the second virtual line L2 which is parallel to the first arrangement direction. The flexible strip 152 located on the other side in a direction orthogonal to the first arrangement direction, i.e., right in FIG. 4, is L-shaped. The flexible strip 152 includes a first section 154 extending along the second virtual line L2 parallel to the first arrangement direction, and a second section 155 extending from one end of the first section 154 in the first arrangement direction, i.e., the end connected near the middle part 40, and along the middle part 40. Note that the gap 153 extends in an almost L-shape and is surrounded by the flexible strips 151, 152 and the middle part 40.

The operation lever 120 may be configured from an elongated material to thereby allow a single operation lever 120 to simultaneously apply an external force in the direction of the arrow A to the protrusions 13 of a plurality of probe pins 10.

In the probe pin 10 according to the first embodiment, the first contact part 20 is configured to move relative to the middle part 40 by way of the first flexible part 11 in a first arrangement direction, and the first arrangement direction connects the first contact part 20 and the middle part 40; the second contact part 30 is configured to move relative to the middle part 40 in a direction intersecting with the first arrangement direction by way of the movable part 12. Thus, a probe pin 10 may be achieved where the probe pin 10 contacts an inspection object (e.g., the electrode 111 of a board-to-board connector 110) in a direction that is different from the direction the probe pin 10 contacts an inspection device (e.g., the substrate 100 of the inspection device).

The probe pin 10 also includes a protrusion 13 connected to the second contact part 30 and extending from the second contact part 30 in a direction intersecting with the first arrangement direction; the movable part 12 includes a second flexible part 15 extending along the first arrangement direction. The second flexible part 15 is configured to deform elastically in a direction intersecting with the first arrangement direction. The second flexible part 15 deforms elastically due to an external force applied to the second contact part 30 via the protrusion 13 whereby the second contact part 30 rotates about the connection part 16 between the second flexible part 15 and the middle part 40 so that the second contact part 30 moves relative to the middle part 40 in a direction intersecting with the first arrangement direction. Hereby, a probe pin 10 can be easily implemented which is capable of contacting an inspection object in a direction that is different from the direction the probe pin contacts the inspection device.

Note that the external force added to the protrusions 13 is not limited to the direction depicted by the arrow A in FIG. 2; the external force may from any direction so long as the second contact part 30 elastically deforms in accordance with the external force added to the second contact part 30 via the protrusions 13, and the second contact part 30 rotates about the connection part 16 between the second flexible part 15 and the middle part 40. For example, an external force may be added to the protrusions 13 so that the protrusions 13 move away from the second contact part 30 in a direction intersecting with the first arrangement direction, i.e., arrow B in FIG. 2.

The notch 14 on the protrusion 13 is half-circle, and the section of the operation lever 120 connecting with the notch 14 is a half-circle that matches the notch 14; this maintains a stable connection between the protrusion 13 and the operation lever 120 when the operation lever 120 moves linearly in a direction depicted by the arrow A, and allows the second contact part 30 to rotate stably.

The probe pin 10 allows an inspection jig 2 according to the first embodiment to support a diverse set of inspection devices and inspection objects. That is, for instance, even in cases where a display panel is composed of a material was weak mechanical strength such as an organic EL, the display panel module may be inspected without damaging the display panel.

Further, the aforementioned inspection jig 2 allows implementation of the aforementioned inspection unit 1 which can thus support a diverse set of inspection devices and inspection objects.

Finally, the aforementioned inspection unit 1 allows implementation of the aforementioned inspection device which can thus support a diverse set of inspection devices and inspection objects.

Note that as illustrated in FIG. 2, the inspection jig 2 houses the probe pin 10 in a receptacle 53 while the middle part 40 is in contact with the stopper 56. In other words, the stopper 56 supports the middle part 40 of the probe pin 10 and stops the same from moving in the first arrangement direction from the first contact part 20 toward the second contact part 30. Thus, the elastic deformation of the first flexible part 11 has no effect on the second contact part 30, and the second contact part 30 moves relative to the middle part 40 reliably in a direction intersecting with the first arrangement direction because the stopper 56 supports and locks the middle part 40. This is possible even if the first contact 21 makes contact with, for example, the substrate 100 of the inspection device, and the first contact part 20 is pressed toward the second contact part 30 along the first arrangement direction, i.e., toward inside the receptacle 53. In other words, the stored probe pin 10 reliably allows implementation of an inspection jig 2 capable of contacting an inspection object in a direction that is different from the direction the probe pin 10 contacts the inspection device.

The various configurations, such as the shape, or the like, of a probe pin 10 of the first embodiment may be modified as appropriate according to the design of the probe pin 10. For example, the shapes and locations of the first contact 21 and the second contact 31 may each be modified as appropriate in accordance with the various types of inspection devices or inspection objects.

Figure 5:
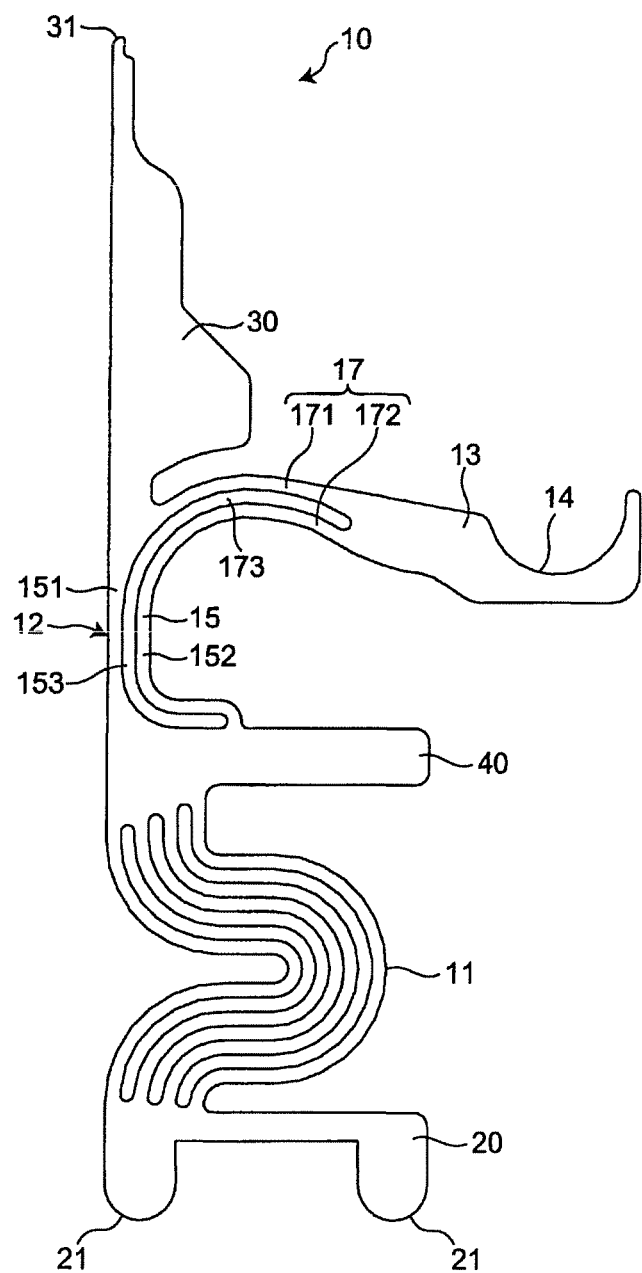
FIG. 5 is a plan view for describing a first example of modifying the probe pin in FIG. 3.

As an additional example, the protrusion 13 may include a third flexible part 17 provided in the direction the protrusion 13 extends at the end closer to the second contact part 30 as illustrated in FIG. 5. The third flexible part 17 may be configured to deform elastically in the first arrangement direction and toward the first contact part 20. More specifically, the third flexible part 17 in the probe pin 10 (FIG. 5) is made up of a plurality of flexible strips (in this embodiment, two flexible strips 171, 172) arranged with alternating gaps 173 therebetween. One flexible strip 171 is connected to the linear flexible strip 151 in the second flexible part 15, and the other flexible strip 172 is connected to the substantially L-shaped flexible strip 152 and the second flexible part 15. The gap 173 between the two flexible strips 171, 172 is also connected to the gap 153 in the second flexible part 15.

Figure 6:
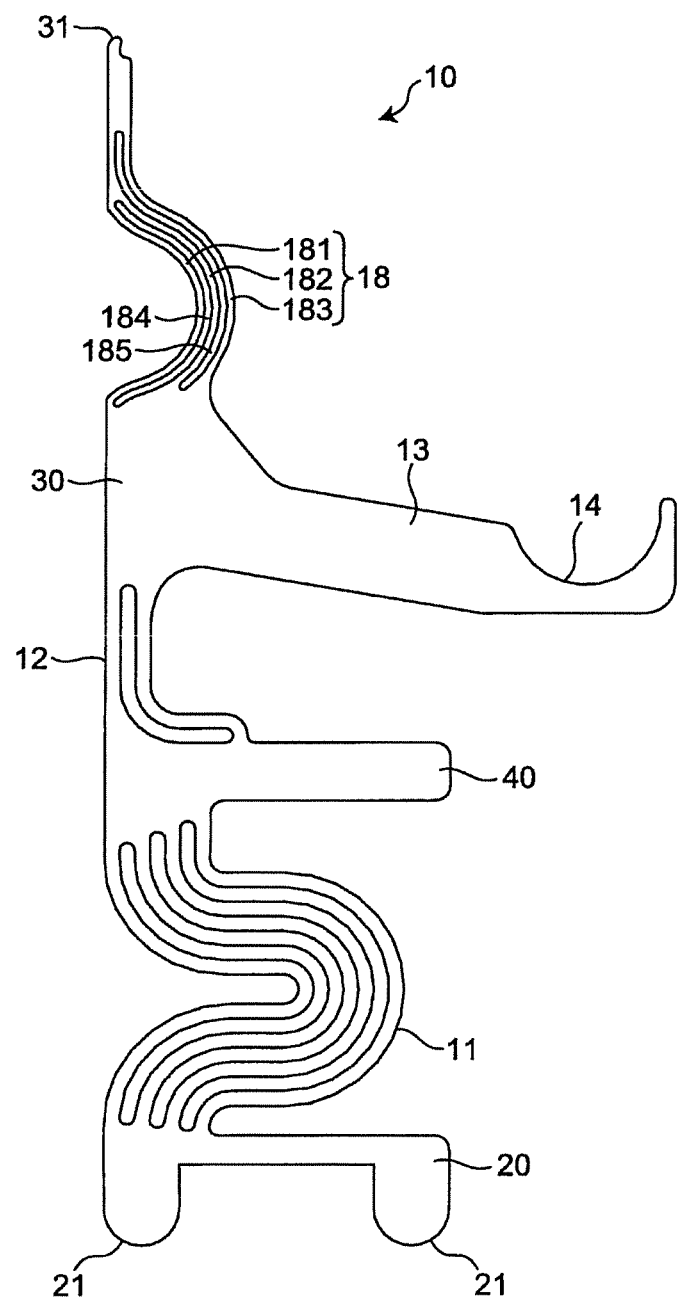
FIG. 6 is a plan view for describing a second example of modifying the probe pin in FIG. 3.

For example, a fourth flexible part 18 that deforms elastically in a direction intersecting with the first arrangement direction may be provided between the second contact 31 on the second contact part 30 and the protrusion 13 as illustrated in FIG. 6. More specifically, the fourth flexible part 18 in the probe pin 10 (FIG. 6) is made up of a plurality of flexible strips (in this embodiment, three flexible strips 181, 182, 183) arranged with alternating gaps 184, 185 therebetween.

As illustrated in FIG. 5 and FIG. 6, the third flexible strip 17 is provided in the protrusion 13 and/or the fourth flexible strip 18 is provided in the second contact part 30; thus, any stress occurring in the second contact part 30 is dispersed. For example, as illustrated in FIG. 2, the probe pin 10 may be provided in an inspection jig 2. Here, an external force may be applied to the protrusion 13 and the second contact 31 on the second contact part 30 moves in a direction intersecting with the first arrangement direction and contacts the electrode 111 on the board-to-board connector 110. Here, the probe pin 10 is prevented from damage when excess stress is applied to the second contact part 30.

Figure 7:
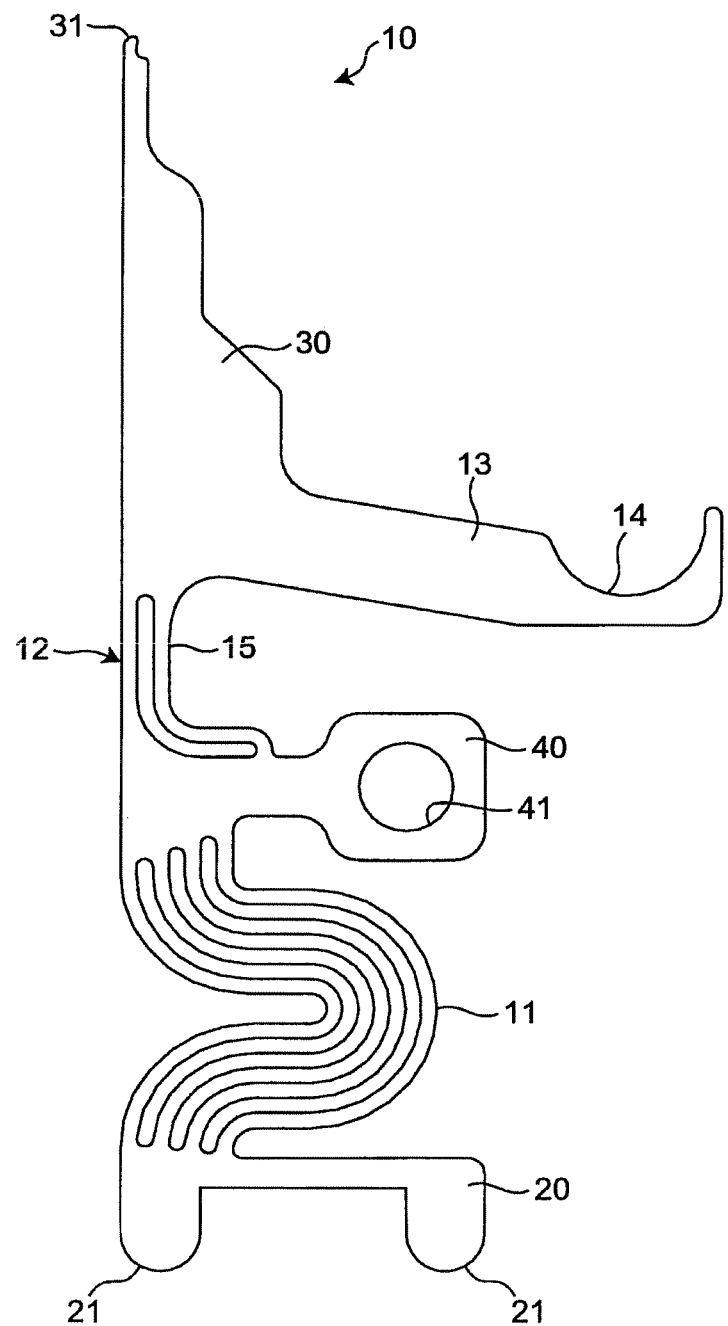
FIG. 7 is a plan view for describing a third example of modifying the probe pin in FIG. 3.

For example, the middle part 40 may also be provided with a through-hole 41 through the thickness thereof as illustrated in FIG. 7. The through-hole 41 may be substantially circular allowing a substantially cylindrical connecting rod (not shown) to be placed therein. The connecting rod unifies the plurality of probe pins 10, and a portion of the connecting rod may be received in a corresponding receptacle 53. A socket 50 housing the probe pin 10 illustrated in FIG. 7 is provided with a coupling hole (not shown) passing through each receptacle 53 in the arrangement direction thereof. The connecting rod is placed in the coupling hole. In this case, a second stopper (not shown) may be provided to the socket 50, instead of (or in addition to) the stopper 56. The second stopper locks both ends of the connecting rod to the socket 50, preventing the first contact part 20 from moving along the first arrangement direction toward the second contact part 30.

The first through fourth flexible parts 11, 15, 17, 18 are not limited to being made up of the plurality of flexible strips 111, 112, 113, 114, 151, 152, 171, 172, 181, 182, 183. The first through fourth flexible parts 11, 15, 17, 18 may be configured from a single flexible strip.

Figure 8:
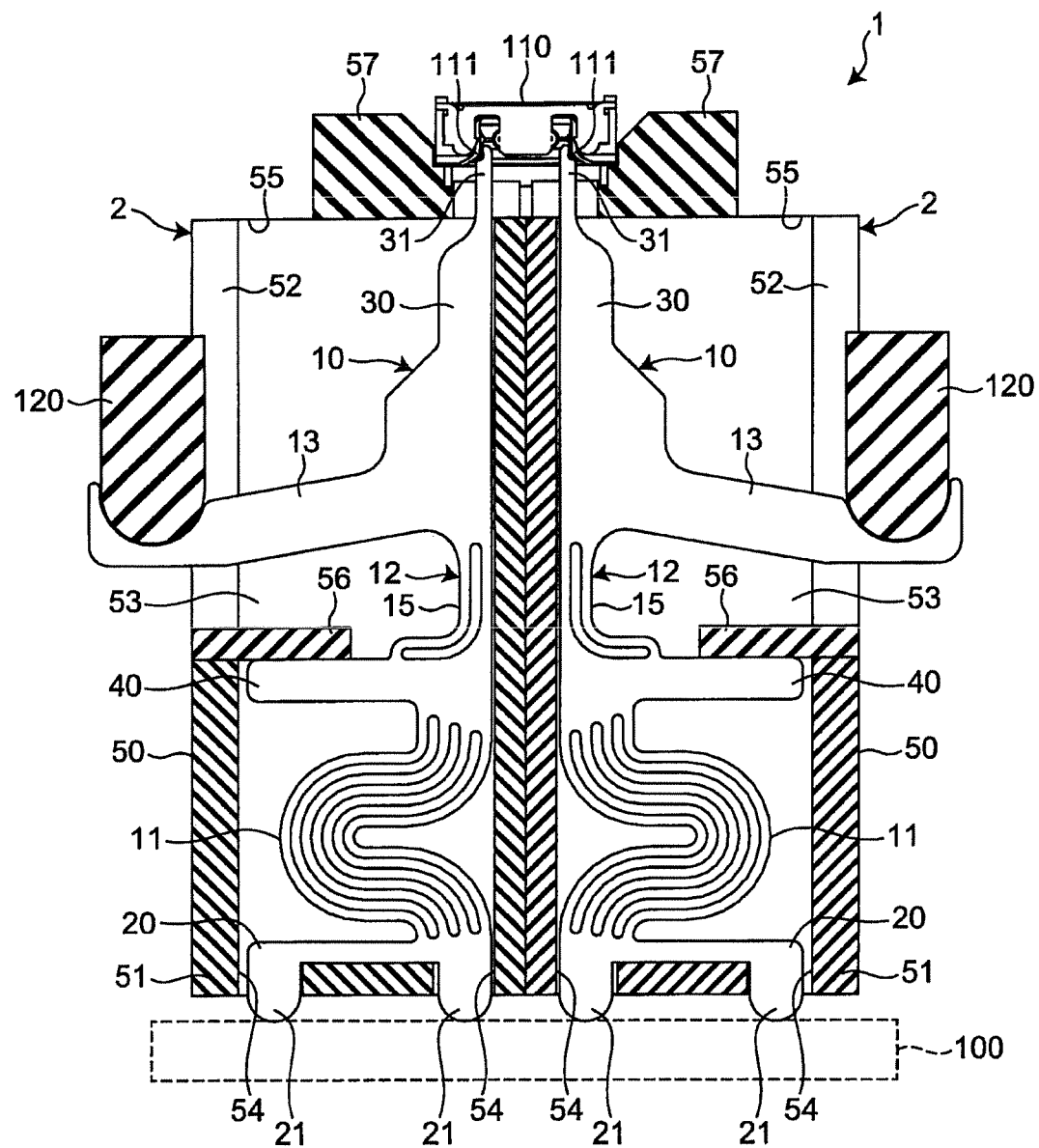
FIG. 8 is a cross-sectional view for describing an example of modifying the inspection unit and the inspection jig in FIG. 1.
Figure 9:
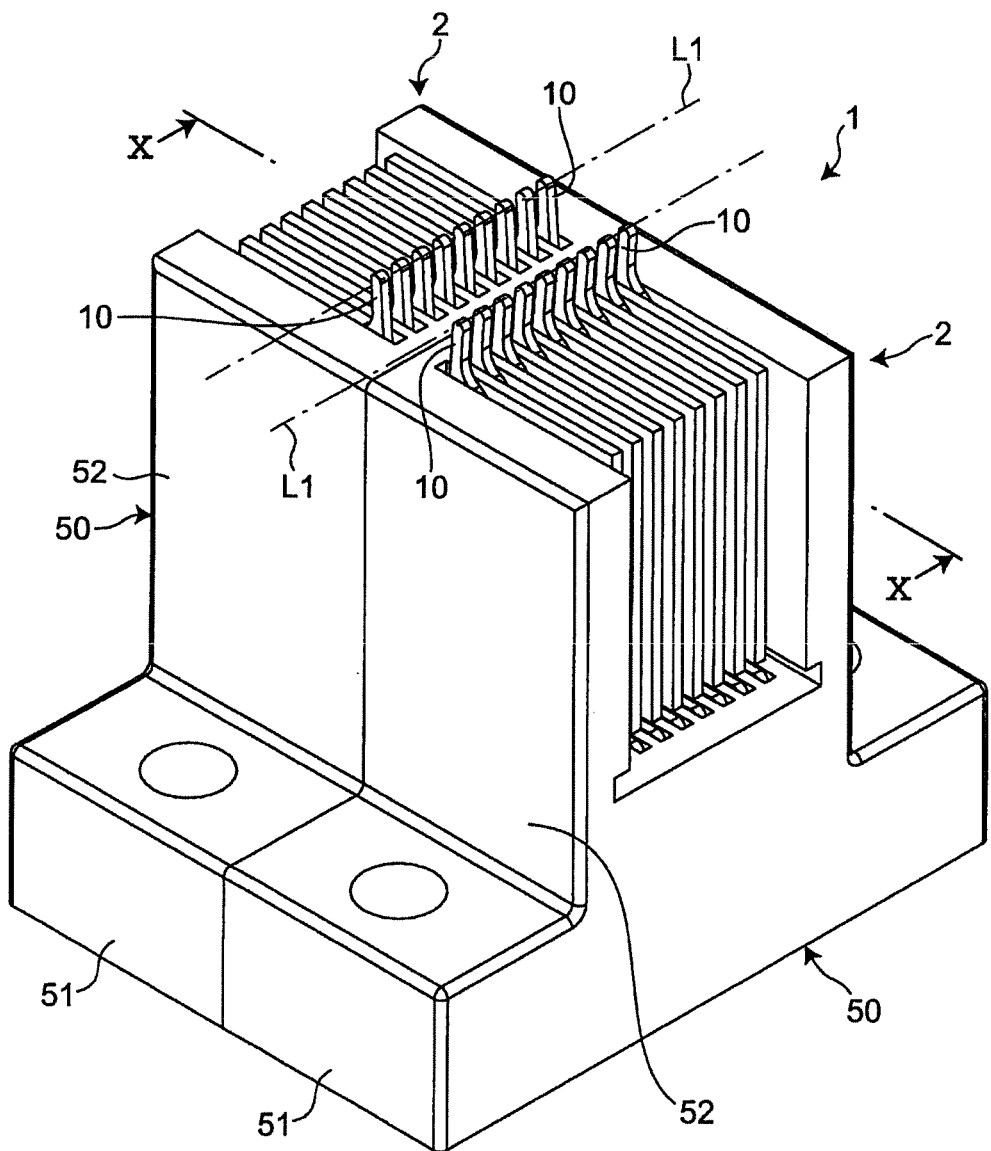
FIG. 9 is a perspective view illustrating an inspection unit and an inspection jig according to a second embodiment.

The configuration of the inspection jig 2 may be modified as appropriate in accordance with the various types of inspection devices or inspection objects. For example, a movement limiter 57 may be provided on one end of the socket 50 near the second opening 55 as illustrated in FIG. 8. The movement limiter 57 restricts the movements of the second contact part 30 in the direction that the second contact 31 of the second contact part 13 moves when an external force is added to the protrusion 13, i.e., a direction intersecting with the first arrangement direction. The movement limiter 57 prevents damage to the probe pins 10 when excess stress is added to the second flexible part 15 of the movable part 12 when an external force is applied to the protrusion 13 and the second contact 31 of the second contact part 30 moves in a direction intersecting with the first arrangement direction.

The inspection jig 2 may be made more general purpose to thereby improve productivity of the inspection unit 1 (and by extension, the inspection device).

Second Embodiment

A probe pin 10 according to the second embodiment herein differs from the first embodiment in that the second contact part 30 and the movable part 12 extend in a second arrangement direction that intersects with the first arrangement direction, and the movable part 12 includes a fifth flexible part 60 as illustrated in FIG. 9 through FIG. 12.

The components in the second embodiment that are identical to the components in the first embodiment are given the same reference numerals and descriptions thereof are omitted; only the features that are different from the first embodiment are described.

Figure 12:
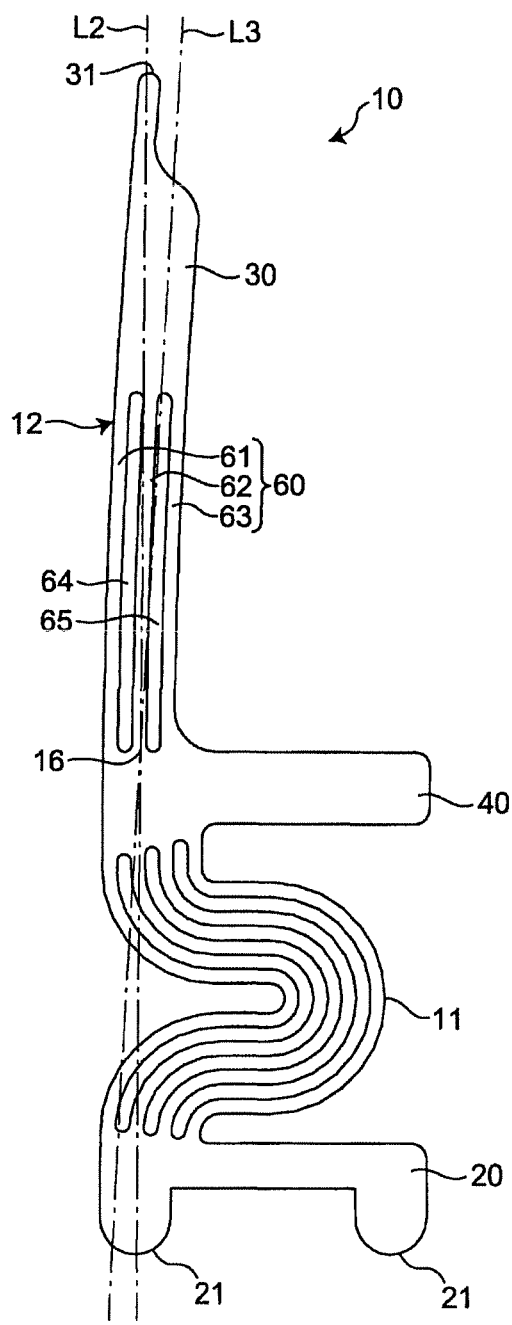
FIG. 12 is a plan view of the probe pin in FIG. 11.

The second contact part 30 and the movable part 12 intersects with a second virtual line L2 extending along the first arrangement direction and extends along a third virtual line L3 passing through the connection part 16 connecting the fifth flexible part 60 and the middle part 40 as illustrated in FIG. 12.

The fifth flexible part 60 is connected at one end in the second arrangement direction to the middle part 40 and connected at the other end in the second arrangement direction to the second contact part 30 as illustrated in FIG. 12; the fifth flexible part 60 is configured to deform elastically in a direction intersecting with the first arrangement direction and the second arrangement direction.

More specifically, the fifth flexible part 60 is made up of a plurality of flexible strips (in this embodiment, three flexible strips 61, 62, 63) arranged with alternating gaps 64, 65 therebetween. The flexible strips 61, 62, 63 include linear parts along the second arrangement direction and deform elastically in accordance with an external force applied to the second contact part 30, whereby the second contact part 30 rotates about the connection part 16 between the fifth flexible part 60 and the middle part 40 so that the second contact part 30 moves relative to the middle part 40 in a direction intersecting with the first arrangement direction and the second arrangement direction.

The second contact 31 in an inspection jig 2 using a probe pin 10 according to the second embodiment may be connected to an inspection object (e.g., the electrode 111 of the board-to-board connector 110) in the following manner.

Figure 10:
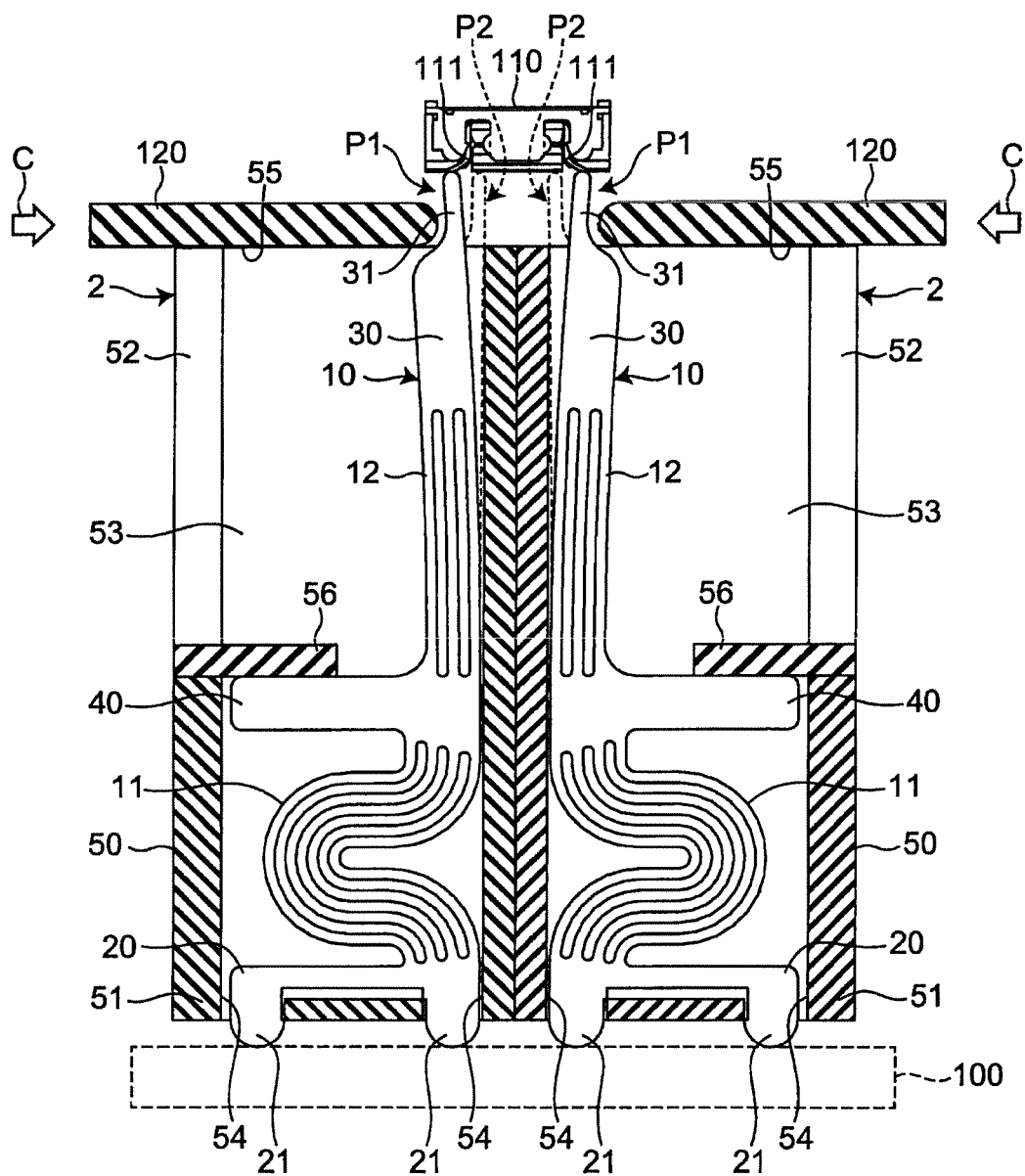
FIG. 10 is a cross-sectional view along the line X-X.
Figure 11:
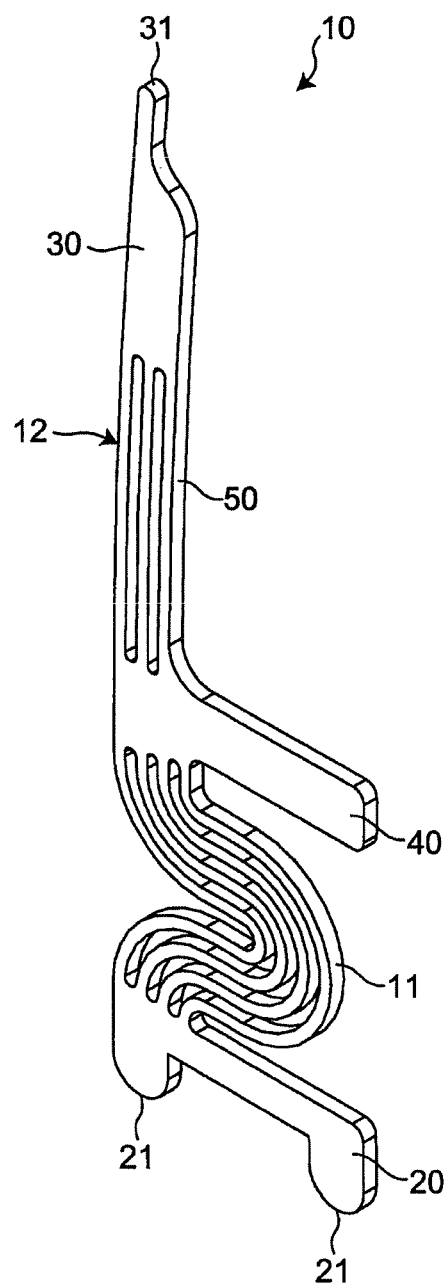
FIG. 11 is a perspective view of a probe pin according to the second embodiment.

That is, first, a second contact part 30 in a rest position P1 where no external forces applied (FIG. 10) may be moved to an operation position P2 (FIG. 10) where an external force is applied to the second contact part 30 via the operation lever 120 thereby moving the second contact part 30 in a direction intersecting with the second arrangement direction and towards the second virtual line L2, i.e., arrow C in FIG. 10. At this point, the fifth flexible part 60 elastically deforms in a direction intersecting with the first arrangement direction and the second arrangement direction and in a direction such that the extension direction of the second contact part 30 and the movable part 12 is parallel to the first arrangement direction, i.e., arrow C.

The electrode 111 of the board-to-board connector 110 is moved while the second contact part 30 is at the operation position P2, so that the electrode 111 is positioned between the second virtual line L2 and the third virtual line L3. If the operation lever 120 is then removed, the return force from the fifth flexible part 60 causes the second contact part 30 to rotate about the connection part 16 between the fifth flexible part 60 and the middle part 40 thereby rotating the second contact part 30 from the operation position P2 toward the rest position P1. The second contact 31 and the electrode 111 then make contact.

In a probe pin 10 according to the second embodiment, the second contact part 30 and the movable part 12 extend along a second arrangement direction that intersects with the first arrangement direction, and the movable part 12 includes fifth flexible part 60 capable of deforming elastically in a direction intersecting with the second arrangement part. The fifth flexible part 60 deforms elastically in accordance with an external force applied to the second contact part 30 whereby the second contact part 30 rotates about a connection part 16 between the fifth flexible part 60 and the middle part 40 so that the second contact part 30 moves relative to the middle part 40 in a direction intersecting with the first arrangement direction and the second arrangement direction. Hereby, a probe pin 10 can be easily implemented which is capable of contacting an inspection object in a direction that is different from the direction the probe pin contacts the inspection device.

Figure 13:
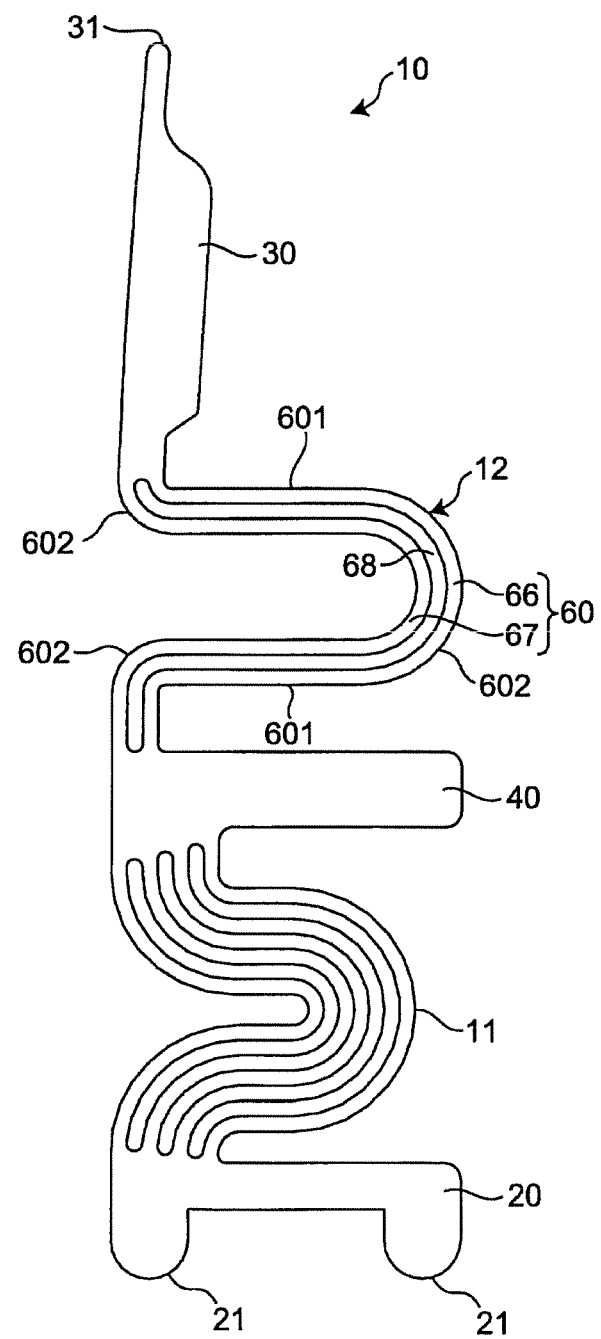
FIG. 13 is a plan view for describing a first example of modifying the probe pin in FIG. 11.

The fifth flexible part 60 has a winding shape with continuously alternating linear strips 601 that intersect with the second arrangement direction, and curved strips 602 that connect to the linear strips 601 as illustrated in FIG. 13. In the probe pin 10 illustrated in FIG. 13, for example, the fifth flexible part 60 is made up of a plurality of flexible strips (in this embodiment, two flexible strips 66, 67) arranged with alternating gaps 68 therebetween. The flexible strips 66, 67 are each made up of two linear strips 601 and three curved strips 602.

Figure 14:
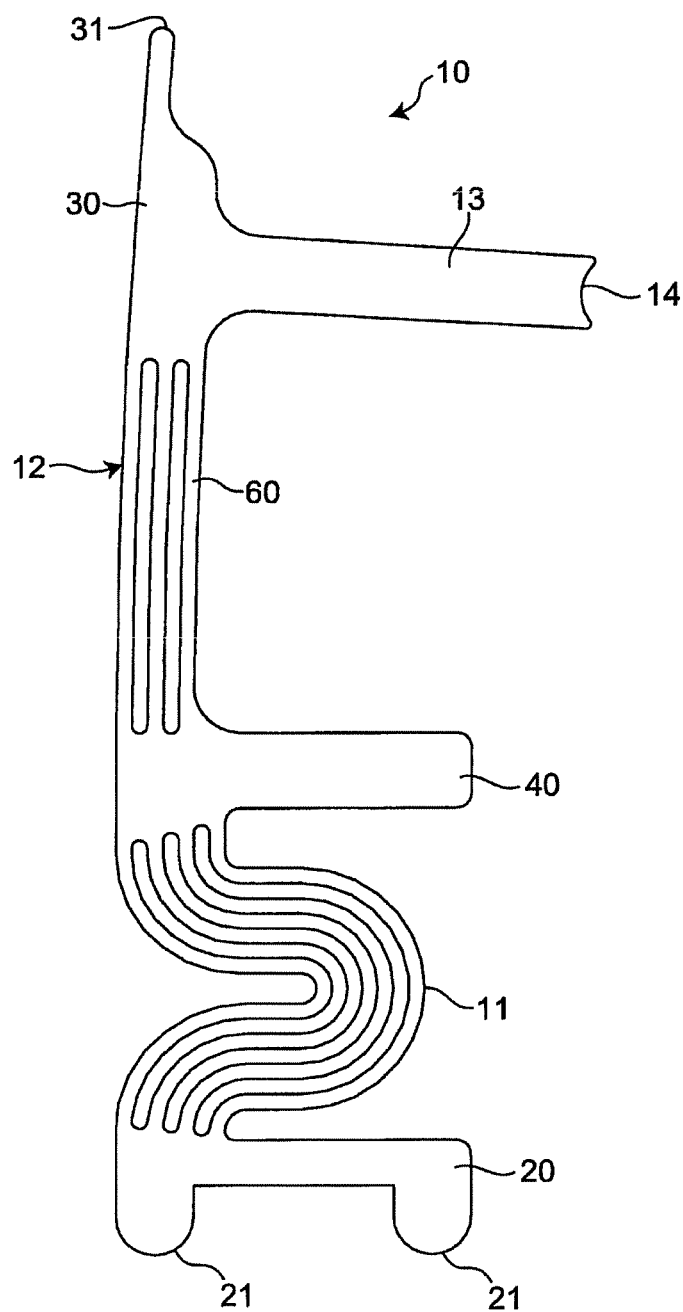
FIG. 14 is a plan view for describing a second example of modifying the probe pin in FIG. 11.

As illustrated in FIG. 14, the probe pin 10 may further include a protrusion 13 extending from the second contact part 30 in a direction intersecting with the second arrangement direction; the probe pin 10 may be configured so that the external force is added to the second contact part 30 via the protrusion 13. The probe pin 10 in FIG. 14 is provided with a half-circular notch 14. The notch 14 is provided at end of the protrusion 13 away from the second contact part 30 in the protrusion direction.

The various configurations, such as the shape, or the like, of fifth flexible part 60 in a probe pin 10 of the second embodiment may be modified as appropriate according to the design of the probe pin 10. This thus provides a probe pin 10 with a highly flexible design.

Third Embodiment

Figure 15:
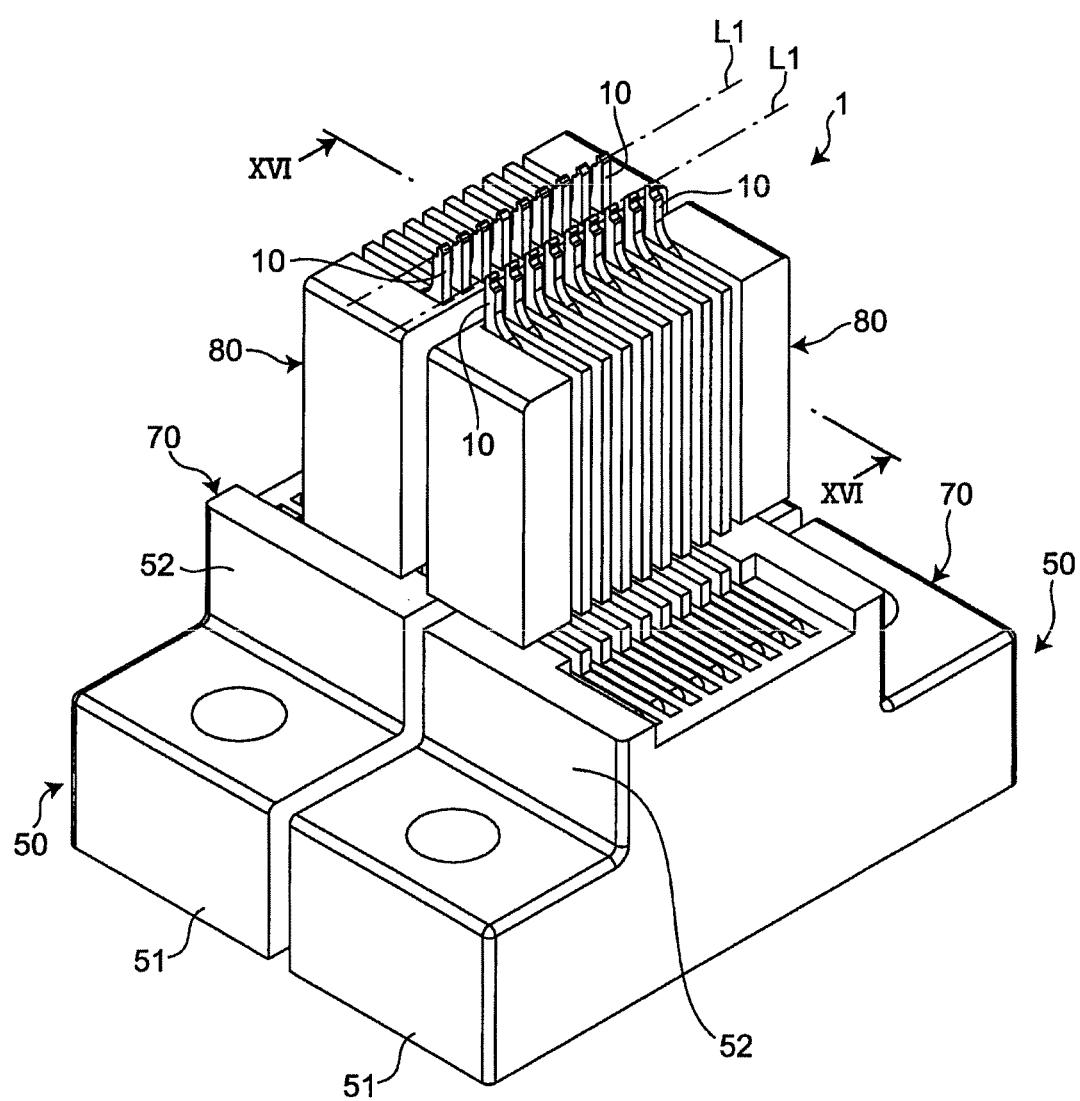
FIG. 15 is a perspective view illustrating an inspection unit and an inspection jig according to a third embodiment.
Figure 16:
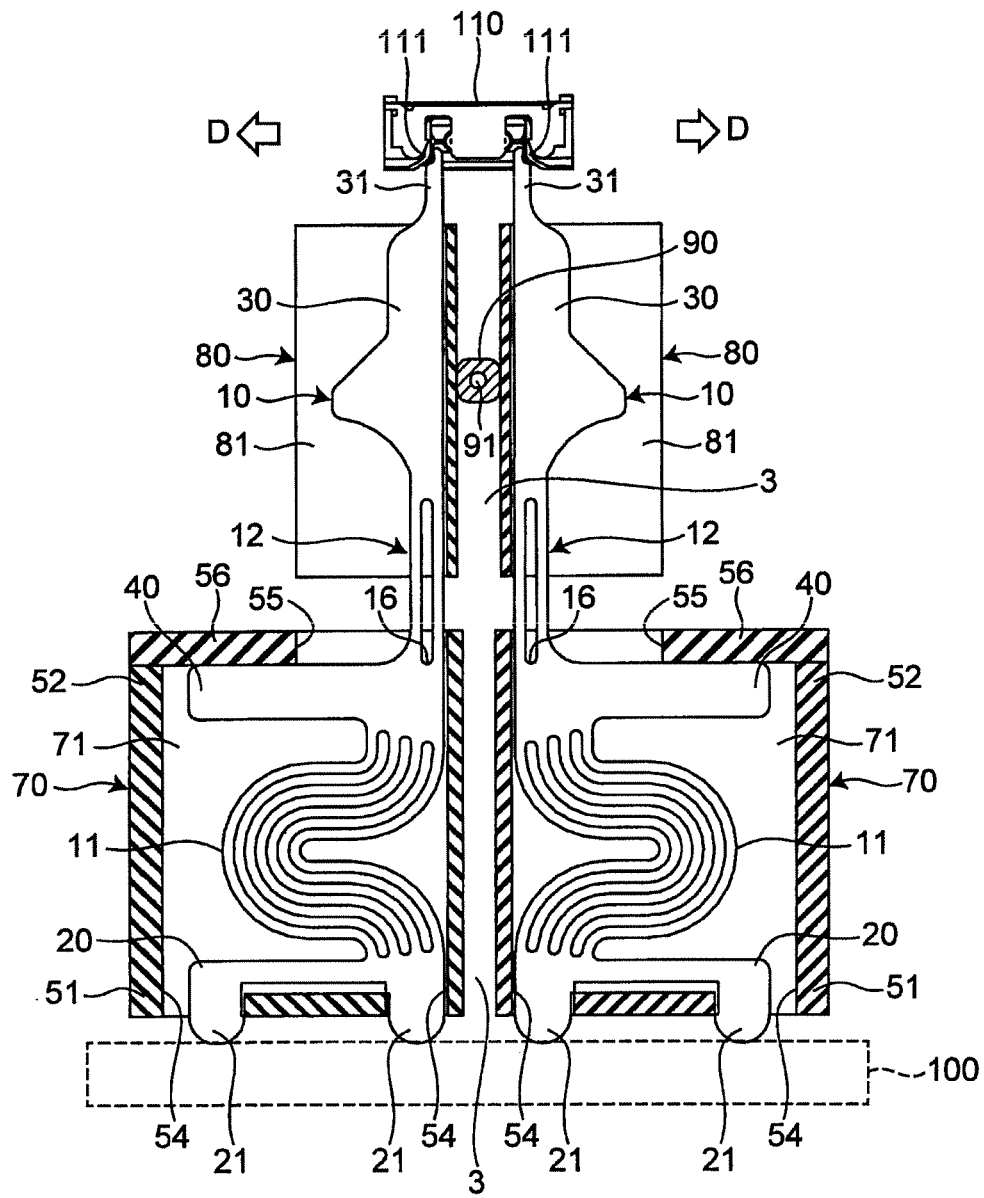
FIG. 16 is a cross-sectional view along the line XVI-XVI.

An inspection jig 2 according to a third embodiment described herein differs from the first embodiment in that the socket 50 includes a first housing 70, a second housing 80, and a cam 90 as illustrated in FIG. 15 and FIG. 16.

The components in the third embodiment that are identical to the components in the first embodiment are given the same reference numerals and description thereof are omitted; only the features that are different from the first embodiment are described.

Except for omitting the protrusion 13, a probe pin 10 according to the third embodiment is identical to a probe pin 10 according to the first embodiment.

As illustrated in FIG. 15, the first housing 70 is a roughly T-shaped box configured from a flat part 51 and a rectangular body 52; as illustrated in FIG. 16, the first housing 70 includes a plurality of first receptacles 71 for accommodating the first contact part 20 and the middle part 40. The first receptacles 71 are slit-like and are capable of receiving and retaining the probe pins 10 so that the probe pins 10 are electrically independent of each other. The first receptacles 71 appear aligned along the length of the flat part 51, i.e., going through the drawing sheet of FIG. 16, when viewed from the connection direction of the flat part 51 and the rectangular body 52, i.e., the vertical direction in FIG. 16. The movable part 12 of the probe pin 10 is exposed outside the first housing 70 from the first opening 55 in each of the first receptacles 71.

The second housing 80 is a substantially cuboid-like (FIG. 15), and includes a second receptacle 81 for accommodating the second contact part 30 (FIG. 16). Similar to the first receptacles 71, the second receptacles 81 are slit-like and are capable of receiving and retaining the probe pins 10 so that the probe pins 10 are electrically independent of each other. The second receptacles 81 appear aligned along the length of the flat part 51 when viewed from the connection direction of the flat part 51 and the rectangular body 52. Both ends of each of the second receptacles 81 open in the connection direction of the flat part 51 and the rectangular body 52. The second contact 31 and the movable part 12 on the probe pins 10 are exposed outside of each of the second receptacles 81. The second housing 80 is also configured to move relatively in relation to the first housing 70 in a direction intersecting with the first arrangement direction, i.e., laterally in FIG. 16.

As illustrated in FIG. 16, adjacent inspection jigs 2 are arranged in the inspection unit 1 with a substantially uniform gap 3 therebetween. The cam 90 is disposed in the gap 3. The cam 90 is a substantially rectangular body configured to rotate about a shaft 91 that extends along the arrangement direction of the receptacles 71, 81. The rotation of the cam 90 moves the second housing 80 in a direction intersecting with the first arrangement direction; the second contact part 30 of the probe pin 10 moves in a direction intersecting with the first arrangement direction as the second housing 80 moves.

The second contact 31 in an inspection jig 2 according to the third embodiment may be connected to an inspection object (e.g., the electrode 111 of the board-to-board connector 110) in the following manner.

In other words, first, the electrode 111 of the board-to-board connector 110 is moved while no external force is applied to the second contact part 30; the electrode 111 is brought next to the second contact 31 on the opposite side of the cam 90 in the first arrangement direction. When the cam 90 is rotated, the second housing 80 moves in the first arrangement direction away from the cam 90, i.e., in the direction of the arrow D in FIG. 18, and the second contact part 30 on the probe pin 10 moves in the direction of the arrow D. Hereby, the second contact part 30 rotates about a connection part 16 between the movable part 12 and the middle part 40 and moves relative to the middle part 40 in a direction intersecting with the first arrangement direction; the second contact 31 and the electrode 111 then make contact.

An inspection jig 2 according to the third embodiment is configured such that the socket 50 includes a first housing 70 accommodating the first contact part 20 and the middle part 40; a second housing 80 accommodating the second contact part 30 and configured to move relatively in relation to the first housing 70 in a direction intersecting with the first arrangement direction; and a cam 90 configured to rock the second housing 80 in a direction intersecting with the first arrangement direction. Thus, the configuration of the inspection jig 2 may be modified as appropriate in accordance with the various types of inspection devices or inspection objects. Additionally, the inspection jig 2 has a highly flexible design which can thus support a diverse set of inspection devices and inspection objects.

Figure 17:
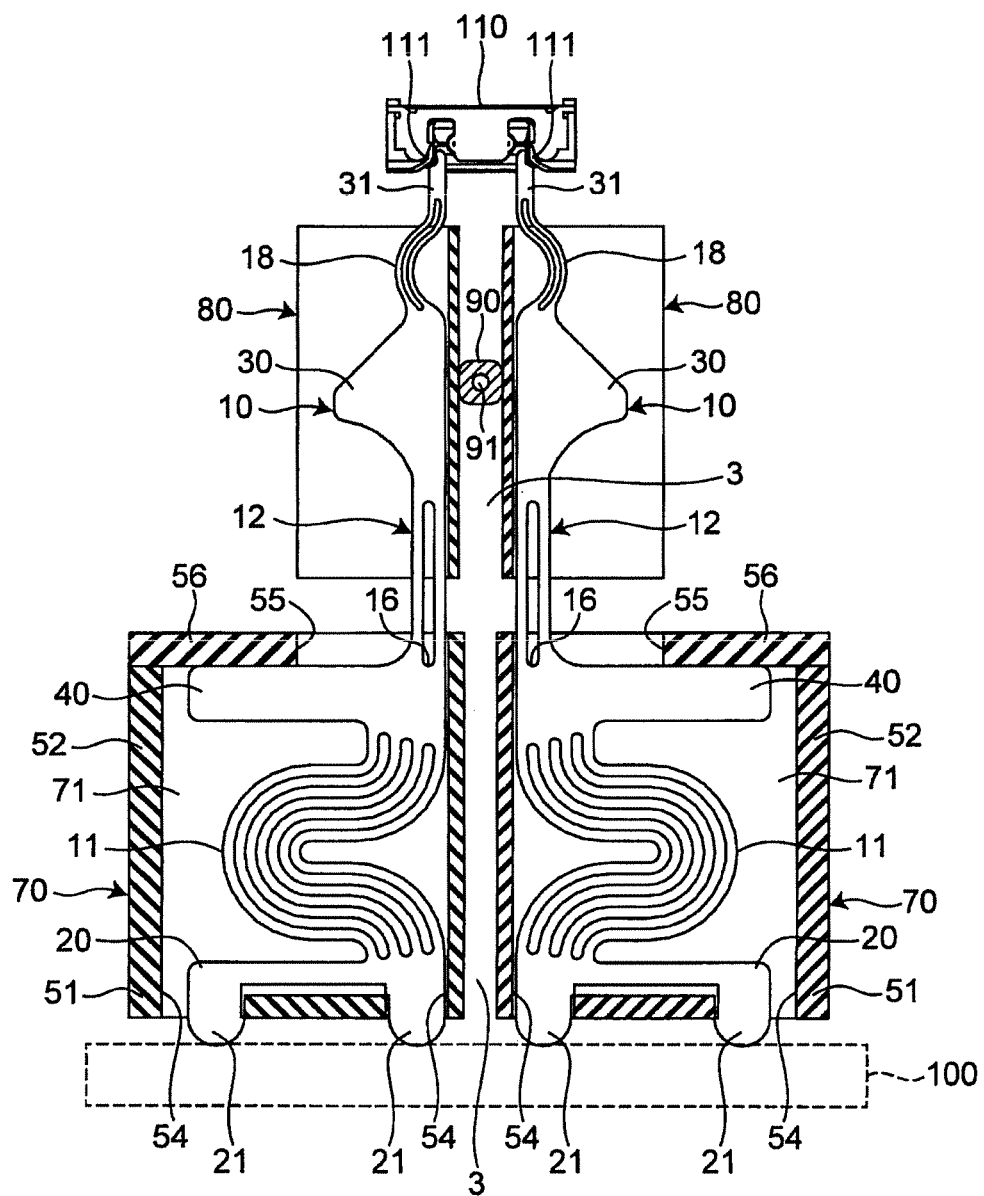
FIG. 17 is a cross-sectional view for describing a first example of modifying the inspection jig in FIG. 15.

Note that the inspection jig 2 according to the third embodiment is not limited to the probe pin 10 illustrated in FIG. 16. For instance, the probe pin 10 used may be provided with fourth flexible part 18 between the second contact 31 of the second contact part 30 and the movable part 12 (FIG. 17).

Figure 18:
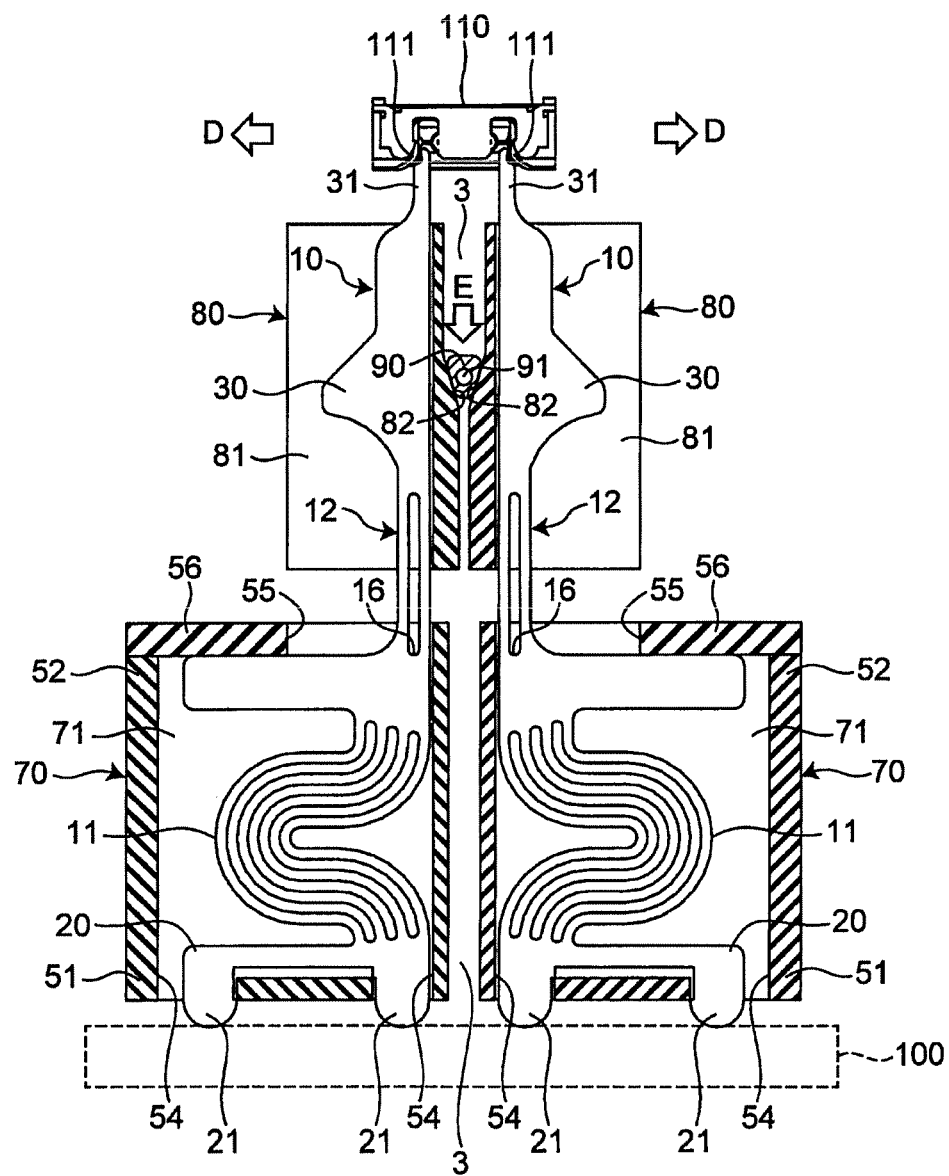
FIG. 18 is a cross-sectional view for describing a second example of modifying the inspection jig in FIG. 15.

The cam 90 is not limited to a configuration where the rotation thereof about the shaft 91 moves the second housing 80 linearly in the direction of the arrow D. For example, as illustrated in FIG. 18, the cam 90 may be configured to move linearly along the first arrangement direction, i.e., the direction of the arrow E in FIG. 18, to move the second housing 80 linearly in a direction orthogonal to the first arrangement direction, i.e., the direction of the arrow D in FIG. 18. In this case, the cam 90 may be a triangular pillar capable of moving in the first arrangement direction about the shaft 91, and may be arranged so that one side thereof is orthogonal to the first arrangement direction. The second housing 80 may also include an inclined surface 82 arranged facing one side of the cam 90 and able to make contact therewith.

The probe pin 10 described herein is provided with a first contact part 20 and a second contact part 30; a middle part 40 arranged between the first contact part 20 and the second contact part 30; a first flexible part 11 connecting the first contact part 20 and the middle part 40 and expanding and contracting along a first arrangement direction; and a movable part 12 connecting the middle part 40 and the second contact part 30 and configured to move the second contact part 30 in a direction intersecting with the first arrangement direction. It is sufficient that the first contact part 20, the first flexible part 11, the middle part 40, the movable part 12, and the second contact part 30 are arranged linearly; the probe pin 10 is thus not limited to the first through third embodiments.

Here ends the description of various working embodiments of the disclosure with reference to the drawings. Lastly, various other aspects of the present disclosure are described. As an example, the following description includes reference numerals.

A first embodiment of the probe pin 10 described herein includes:

a first contact part 20 and a second contact part 30;

a middle part 40 located between the first contact part 20 and the second contact part 30;

a first flexible part 11 connected to the first contact part 20 and the middle part 40 and expanding and contracting along a first arrangement direction connecting the first contact part 20 and the middle part 40 to move the first contact part 20 relative to the middle part 40 in the first arrangement direction; and a movable part 12 connected to the middle part 40 and the second contact part 30 and configured to move the second contact part 30 relative to the middle part 40 in a direction intersecting with the first arrangement direction; wherein the first contact part 20, the first flexible part 11, the middle part 40, the movable part 12, and the second contact part 30 are arranged linearly.

The first contact part 20 in the probe pin 10 of the first embodiment is configured to move relative to the middle part 40 by way of the first flexible part 11 in a first arrangement direction, the first arrangement direction connecting the first contact part 20 and the middle part 40; the second contact part 30 is configured to move relative to the middle part 40 in a direction intersecting with the first arrangement direction by way of the movable part 12. Thus, a probe pin 10 may be achieved where the probe pin 10 contacts an inspection object (e.g., the electrode 111 of a board-to-board connector 110) in a direction that is different from the direction the probe pin 10 contacts an inspection device (e.g., the substrate 100 of the inspection device).

A second embodiment of the probe pin 10 described herein includes:

a protrusion 13 connected to the second contact part 30 and extending from the second contact part 30 in a direction intersecting with the first arrangement direction; wherein:

the movable part 12 includes a second flexible part 15 extending along the first arrangement direction, connected at one end in the first arrangement direction to the middle part 40 and connected at the other end in the first arrangement direction to the second contact part 30, and configured to deform elastically in a direction intersecting with the first arrangement direction; and the second flexible part 15 deforms elastically in accordance with an external force applied to the second contact 30 part via the protrusion 13 whereby the second contact part rotates about a connection part 16 between the second flexible part 15 and the middle part 40 so that the second contact part 30 moves relative to the middle part 40 in a direction intersecting with the first arrangement direction.

A probe pin 10 according to the second embodiment can be easily implemented, with this probe pin 10 capable of contacting an inspection object in a direction that is different from the direction the probe pin contacts the inspection device.

In a third embodiment of the probe pin 10 described herein, the protrusion 13 includes a third flexible part 17 provided in the direction the protrusion 13 extends at the end closer to the second contact part 30 and configured to deform elastically in the first arrangement direction and toward the first contact part 20; and the third flexible part 17 deforms elastically in accordance with an external force applied to the protrusion 13 in the first arrangement direction and toward the first contact part 20.

For example, according to the third embodiment, the probe pin 10 may be provided in an inspection jig 2. Here, an external force may be applied to the protrusion 13 and the second contact 31 on the second contact part 30 moves in a direction intersecting with the first arrangement direction and contacts the electrode 111 on the board-to-board connector 110. Here, the probe pin 10 is prevented from damage when excess stress is applied to the second contact part 30.

In a fourth embodiment of the probe pin 10 described herein, the second contact part 30 extends in the first arrangement direction while connecting to the second flexible part 15 at one end in the first arrangement direction and including a contact 31 at the other end in the first arrangement direction with the protrusion 13 therebetween in the first arrangement direction;

includes a fourth flexible part 18 between the contact 31 and the protrusion 13 in the first arrangement direction, the fourth flexible part 18 configured to deform elastically in a direction intersecting with the first arrangement direction; and the fourth flexible part 18 deforms elastically in accordance with the movement of the contact 31 on the second contact part 30 in a direction intersecting with the first arrangement direction.

For example, according to the fourth embodiment, the probe pin 10 may be provided in an inspection jig 2. Here, an external force may be applied to the protrusion 13 and the second contact 31 on the second contact part 30 moves in a direction intersecting with the first arrangement direction and contacts the electrode 111 on the board-to-board connector 110. Here, the probe pin 10 is prevented from damage when excess stress is applied to the second contact part 30.

In a fifth embodiment of the probe pin 10 described herein, the second contact part 30 and the movable part 12 extend along a second arrangement direction that intersects with the first arrangement direction;

the movable part 12 includes a fifth flexible part 60 connected at one end in the second arrangement direction to the middle part 40 and connected at the other end in the second arrangement direction to the second contact part 30, the fifth flexible part 60 configured to deform elastically in a direction intersecting with the first arrangement direction and the second arrangement direction; and the fifth flexible part 60 deforms elastically in accordance with an external force applied to the second contact part 30 whereby the second contact part 30 rotates about a connection part 16 between the fifth flexible part 60 and the middle part 40 so that the second contact part 30 moves relative to the middle part 40 in a direction intersecting with the first arrangement direction and the second arrangement direction.

A probe pin 10 according to the fifth embodiment can be easily implemented, with this probe pin 10 capable of contacting an inspection object in a direction that is different from the direction the probe pin contacts the inspection device.

In a sixth embodiment of the probe pin 10 described herein, the fifth flexible part 60 has a winding shape with continuously alternating linear strips 601 that intersect with the second arrangement direction, and curved strips 602 connected to the linear strips.

The sixth embodiment provides a probe pin 10 with a highly flexible design.

A seventh embodiment of the probe pin 10 described herein further includes:

a protrusion 13 extending from the second contact part 30 in a direction intersecting with the second arrangement direction, and the probe pin 10 configured so that the external force is added to the second contact part 30 via the protrusion 13.

The seventh embodiment provides a probe pin 10 with a highly flexible design.

An eighth embodiment, which is an inspection jig 2 described herein includes:

the aforementioned probe pin 10; and a socket 50 including a receptacle 53 configured to receive the probe pin 10;

the socket 50 including:

a stopper 56; the stopper 56 preventing the middle part 40 of the probe pin 10 accommodated in the receptacle 53 from moving from the first contact part 20 toward the second contact part 30 along the first arrangement direction.

With the probe pin 10, an inspection jig 2 according to the eighth embodiment can support a diverse set of inspection devices and inspection objects.

A ninth embodiment, which is an inspection jig described herein includes:

a probe pin 10 according to any one of the second through fourth embodiments; wherein the socket 50 includes a movement limiter 57 that restricts the movement of the second contact part 39 in a direction intersecting with the first arrangement direction.

The movement limiter 57 in an inspection jig 2 according to the ninth embodiment prevents damage to the probe pins 10 when excess stress is added to the second flexible part 15 of the movable part 12 when an external force is applied to the protrusion 13 and the second contact 31 of the second contact part 30 moves in a direction intersecting with the first arrangement direction.

A tenth embodiment, which is an inspection jig 2 described herein includes:

the socket 50 including:

a first housing 70 configured to accommodate the first contact part 20 and the middle part 40;

a second housing 80 configured to accommodate the second contact part 30 and to move relatively to the first housing 70 in a direction intersecting with the first arrangement direction; and a cam 90 configured to move the second housing 80 in a direction intersecting with the first arrangement direction.

An inspection jig 2 according to the tenth embodiment has a highly flexible design, and can support a diverse set of inspection devices and inspection objects.

An eleventh embodiment, which is an inspection unit 1 described herein includes:

an inspection jig 2 according to any one of the eighth through tenth embodiments.

Further, the aforementioned inspection jig 2 allows implementation of the aforementioned inspection unit 1 according to the eleventh embodiment, which can thus support a diverse set of inspection devices and inspection objects.

A twelfth embodiment, which is an inspection device described herein includes:

an inspection unit 1 according to the eleventh embodiment.

The aforementioned inspection unit 1 allows implementation of an inspection device according to the twelfth embodiment, which can thus support a diverse set of inspection devices and inspection objects.

Note that the various above-described embodiments and modification examples may be combined as appropriate to obtain the results thereof. Additionally, the embodiments, working examples, or embodiments and example modifications may be combined; however, different embodiments and working examples with similar features may also be combined.

INDUSTRIAL APPLICABILITY

The probe pin described herein may be adopted in an inspection jig used, for example, in inspecting a liquid crystal panel.

The inspection jig described herein may be adopted in an inspection unit used, for example, in inspecting a liquid crystal panel.

The inspection unit described herein may be adopted in an inspection device used, for example, in inspecting a liquid crystal panel.

The inspection device described herein may be used, for example, in inspecting a liquid crystal panel.

The invention claimed is:

1. An inspection jig, the inspection jig comprising:
   a probe pin; and
   a socket including a receptacle configured to receive the probe pin,
   wherein the probe pin comprises:
      a first contact part;
      a second contact part;
      a middle part located between the first contact part and the second contact part;
      a first flexible part connected to the first contact part and the middle part and expanding and contracting along a first arrangement direction connecting the first contact part and the middle part to move the first contact part relative to the middle part in the first arrangement direction; and
      a movable part connected to the middle part and the second contact part and configured to move the second contact part relative to the middle part in a direction intersecting with the first arrangement direction,
   wherein the first contact part, the first flexible part, the middle part, the movable part, and the second contact part are arranged linearly,
   wherein the socket comprises:
      a stopper configured to prevent the middle part of the probe pin accommodated in the receptacle from moving from the first contact part toward the second contact part along the first arrangement direction;
      a first housing configured to accommodate the first contact part and the middle part;
      a second housing configured to accommodate the second contact part and to move relatively to the first housing in a direction intersecting with the first arrangement direction; and
      a cam configured to move the second housing in a direction intersecting with the first arrangement direction.

2. The inspection jig according to claim 1, the probe pin further comprising:
   a protrusion connected to the second contact part and extending from the second contact part in a direction intersecting with the first arrangement direction,
   wherein the movable part includes a second flexible part extending along the first arrangement direction, connected at one end in the first arrangement direction to the middle part and connected at the other end in the first arrangement direction to the second contact part, and configured to deform elastically in a direction intersecting with the first arrangement direction, and wherein the second flexible part deforms elastically in accordance with an external force applied to the second contact part via the protrusion whereby the second contact part rotates about a connection part between the second flexible part and the middle part so that the second contact part moves relative to the middle part in a direction intersecting with the first arrangement direction.

3. The inspection jig according to claim 2,
wherein the protrusion includes a third flexible part provided in the direction the protrusion extends at the end closer to the second contact part and configured to deform elastically in the first arrangement direction and toward the first contact part, and
wherein the third flexible part deforms elastically in accordance with an external force applied to the protrusion in the first arrangement direction and toward the first contact part.

4. The inspection jig according to claim 3,
wherein the second contact part extends in the first arrangement direction while connecting to the second flexible part at one end in the first arrangement direction and including a contact at the other end in the first arrangement direction with the protrusion therebetween in the first arrangement direction,
wherein the second contact part includes a fourth flexible part between the contact and the protrusion in the first arrangement direction, the fourth flexible part configured to deform elastically in a direction intersecting with the first arrangement direction, and
wherein the fourth flexible part deforms elastically in accordance with the movement of the contact on the second contact part in a direction intersecting with the first arrangement direction.

5. An inspection unit provided with the inspection jig according to claim 4.

6. The inspection jig
according to claim 3,
wherein the socket includes a movement limiter that restricts the movement of the second contact part in a direction intersecting with the first arrangement direction.

7. An inspection unit provided with the inspection jig according to claim 6.

8. The inspection jig according to claim 2, wherein
wherein the second contact part extends in the first arrangement direction while connecting to the second flexible part at one end in the first arrangement direction and including a contact at the other end in the first arrangement direction with the protrusion therebetween in the first arrangement direction,
wherein the second contact part includes a fourth flexible part between the contact and the protrusion in the first arrangement direction, the fourth flexible part configured to deform elastically in a direction intersecting with the first arrangement direction, and
wherein the fourth flexible part deforms elastically in accordance with the movement of the contact on the second contact part in a direction intersecting with the first arrangement direction.

9. The inspection jig
according to claim 8
wherein the socket includes a movement limiter that restricts the movement of the second contact part in a direction intersecting with the first arrangement direction.

10. An inspection unit provided with the inspection jig according to claim 9.

11. The inspection jig according to claim 2,
wherein the socket includes a movement limiter that restricts the movement of the second contact part in a direction intersecting with the first arrangement direction.

12. An inspection unit provided with the inspection jig according to claim 11.

13. The inspection jig according to claim 1,
wherein the second contact part and the movable part extend along a second arrangement direction that intersects with the first arrangement direction,
wherein the movable part includes a fifth flexible part connected at one end in the second arrangement direction to the middle part and connected at the other end in the second arrangement direction to the second contact part, the fifth flexible part configured to deform elastically in a direction intersecting with the first arrangement direction and the second arrangement direction, and
wherein the fifth flexible part deforms elastically in accordance with an external force applied to the second contact part whereby the second contact part rotates about a connection part between the fifth flexible part and the middle part so that the second contact part moves relative to the middle part in a direction intersecting with the first arrangement direction and the second arrangement direction.

14. The inspection jig according to claim 13, wherein the fifth flexible part has a winding shape with continuously alternating linear strips that intersect with the second arrangement direction, and curved strips connected to the linear strips.

15. The inspection jig according to claim 14, the probe pin further comprising:
a protrusion extending from the second contact part in a direction intersecting with the second arrangement direction, and the probe pin configured so that the external force is added to the second contact part via the protrusion.

16. An inspection unit provided with the inspection jig according to claim 15.

17. The inspection jig according to claim 13, the probe pin further comprising:
a protrusion extending from the second contact part in a direction intersecting with the second arrangement direction, and the probe pin configured so that the external force is added to the second contact part via the protrusion.

18. An inspection unit provided with the inspection jig according to claim 1.

* * * * *